(12) United States Patent
Jeon et al.

(10) Patent No.: US 8,300,465 B2
(45) Date of Patent: Oct. 30, 2012

(54) SEMICONDUCTOR AND FLASH MEMORY SYSTEMS (75) Inventors: Byung-Gil Jeon, Gyeonggi-do (KR); Kang-Woon Lee, Seoul (KR); Byung-Jun Min, Gyeonggi-do (KR); Han-Joo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 12/843,135

(22) Filed: Jul. 26, 2010

(65) Prior Publication Data

US 2010/0293323 A1    Nov. 18, 2010

Related U.S. Application Data (63) Continuation of application No. 12/040,282, filed on Feb. 29, 2008, now Pat. No. 7,787,297.

(30) Foreign Application Priority Data

Apr. 27, 2007  (KR) .................................. 2007-41415

(51) Int. Cl.
*G11C 16/04* (2006.01)

(52) U.S. Cl. .................. 365/185.11; 365/145; 365/148; 365/158; 365/185.09; 365/185.12

(58) Field of Classification Search .................. 365/145, 365/148, 158, 185.09, 185.11, 185.12
See application file for complete search history.

(56) References Cited

U.S. PATENT DOCUMENTS

| 2004/0193782 | A1* | 9/2004 | Bordui ........................... 711/103 |
| 2005/0050261 | A1* | 3/2005 | Roehr et al. ................... 711/103 |
| 2005/0068802 | A1* | 3/2005 | Tanaka ........................ 365/145 |
| 2006/0279984 | A1  | 12/2006 | Seta et al. |
| 2007/0016719 | A1  | 1/2007 | Ono et al. |

FOREIGN PATENT DOCUMENTS

| JP | 2005-301591 A | 10/2005 |
| KR | 10-2006-0095206 A | 8/2006 |
| KR | 10-2006-0125611 A | 12/2006 |

* cited by examiner

*Primary Examiner* — Hoai V Ho
(74) *Attorney, Agent, or Firm* — Myers Bigel Sibley & Sajovec, P.A.

(57) ABSTRACT

A flash memory device and a flash memory system are disclosed. The flash memory device includes a first non-volatile memory including a plurality of page data cells, storing page data, and reading and outputting the stored page data when a read command is applied from an external portion; and a second non-volatile memory including a plurality of spare data cells respectively adjacent to the plurality of page data cells, storing spare data, scanning the spare data and temporarily storing corresponding information when a file system is mounted, reading and outputting the stored spare data when the read command is applied.

14 Claims, 5 Drawing Sheets

SEMICONDUCTOR AND FLASH MEMORY SYSTEMS

REFERENCE TO PRIORITY APPLICATIONS

This application is a continuation of U.S. application Ser. No. 12/040,282, filed Feb. 29, 2008, now U.S. Pat. No. 7,787,297, which claims priority to Korean Patent Application No. 2007-0041415, filed Apr. 27, 2007, the disclosures of which are hereby incorporated herein by reference in their entirety.

FIELD OF THE INVENTION

The present invention relates to a flash memory device and a flash memory system, and more particularly, to a flash memory device and a flash memory system in which a problem that an operating speed is lowered due to a disadvantage of a flash memory device which does not support a random access when a booting operation is performed in an electronic device system having a flash memory device to which a file system is mounted is improved.

BACKGROUND OF THE INVENTION

These days, the importance of a flash memory is increased due to remarkable development of portable multimedia devices. Of these, a NAND flash memory not only has a storage device of a high capacity but also is relatively low in price compared to other memories, and so it is suitable for a portable storage device.

On the other hand, the NAND flash memory does not support a random access which is supported by memory devices such as SRAM, DRAM, FRAM, MRAM, and PRAM, should perform a data read operation in a page unit and should perform a data write operation after erasing previous data. For these reasons, it takes a long time to write data, and an actual use of the NAND flash memory requires a lot of complementation in a software side due to a limitation to the number of data write times.

For example, data should be stored according to a certain rule in order to store and read data in a computing device, and what names a file, locates a position (directory) of a file and expresses information related to security and authority logically and physically is called a file system.

A file system designed to read and write data in a file unit for a characteristic of the NAND flash memory is a Yet Another Flash Filing System (YAFFS) which is a log-structured file system which automatically provides a wear leveling function and the strength for the power interruption.

Here, a flash memory has a limited life span that data can be recorded in each sector, and the wear leveling function is a softwarical method which prevents an electrical erasing operation for repetitively being performed for a certain sector so that an electric erasing operation can be uniformly performed for all sectors and so all sectors can be evenly used, thereby leveling a life span of all sectors.

Figure 1:
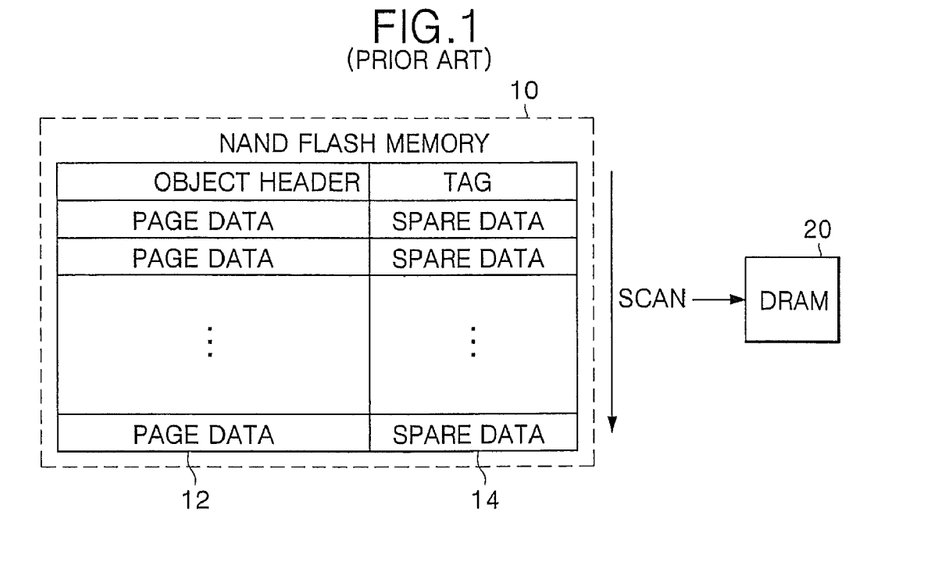
FIG. 1 is a block diagram illustrating a conventional flash memory device having a file system mounted therein.

FIG. 1 is a block diagram illustrating a conventional flash memory device having a file system mounted therein. As shown in FIG. 1, a NAND flash memory 10 and a DRAM 20 are provided. The NAND flash memory 10 comprises a plurality of page data cells 12 and a plurality of spare data cells 14.

In FIG. 1, the NAND flash memory 10 has a plurality of pages which are formed such that object headers comprised of a plurality of page data stored in a plurality of page data cells 12 match with a plurality of tags stored in a plurality of spare data cells 14 by one-to-one correspondence.

The NAND flash memory 10 stores page data such as the size of data and a file to be written from an external portion and information as to whether data are read or written in a plurality of page data cells 12 and stores spare data such as a boot loader, an error correcting code (ECC), information about a bad block, and information about the number of deletion times in a plurality of spare data cells 14. This is because the NAND flash memory 10 allows weak cells more or less and so an additional storage space for storing these information are needed.

The DRAM 20 receives information which are stored by scanning the object header data stored in a plurality of page data cells 12 and the tag data in a plurality of spare data cells and performs an address-mapping operation for them in a tree structure when the file system is mounted in the flash memory device attached to a portable multimedia device.

However, since the flash memory device can not support a random access, in order to boot the flash memory device mounted onto the system, relevant data are first copied to the DRAM 20 which supports a random access, and then a central processing unit (CPU) accesses the DRAM 20 to perform a program.

At this time, a mounting time is very long since the DRAM 20 scans data in the NAND flash memory 10 to select a file, and a data erase operation should be performed in advance before recording data in order to record data, and a softwarical complementation such as a wear leveling for levelly recording data in the whole flash memory is needed due to a garbage collection for reducing a recording time and a limitation to the number of recording times.

Here, the garbage collection is a task for gathering garbage areas of a storage device so that a program can use them, and the garbage area is an area which is actually not being used and can not be used by another program since a user program asks a storage device to use a certain area necessary for an operating system but does not return the area even after finishing a use of the area.

Figure 2:
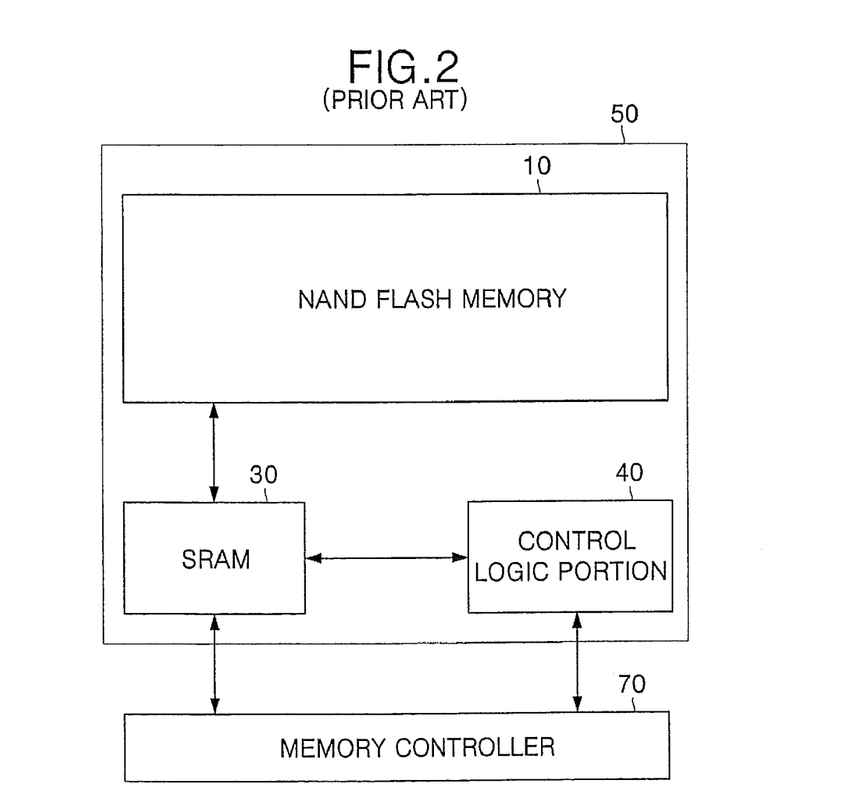
FIG. 2 is a block diagram illustrating a booting operation of a one NAND chip which improves reading and writing speeds of the conventional flash memory device.

FIG. 2 is a block diagram illustrating a booting operation of a one NAND chip which improves reading and writing speeds of the conventional flash memory device. As shown in FIG. 2, a NAND flash memory 10, an SRAM 30, and a control logic portion 40, a memory controller 70 are provided. The NAND flash memory 10 comprises a plurality of page data cells and a plurality of spare data cells.

Functions of the components which perform a booting operation of the one NAND chip are described below with reference to FIG. 2.

The NAND flash memory 10 stores page data such as the size of data and a file to be written from an external portion and information as to whether data are read or written in a plurality of page data cells and stores spare data such as a boot loader, an ECC, information about a bad block, and information about the number of deletion times in a plurality of spare data cells.

The SRAM 30 receives the booting code dumped from the boot loader stored in a plurality of spare data cells of the NAND flash memory 10 to store the information while serving as a data write and read buffer.

The control logic portion 40 comprises a register, an ECC circuit, and an address generating circuit. The control logic portion 40 stores an address and a command provided outside the chip, corrects a one-bit error when data are transferred to the SRAM 30 from the NAND flash memory 10, and receives an initial address of data to be read and then automatically generates addresses and store them in the SRAM 30 again.

The memory controller 70 receives the booting code which is dumped to and temporarily stored in the SRAM 30 to boot a corresponding operating system of an electronic device system by using a predetermined booting program and provides address information containing an initial address of read data and a command to the control logic portion 40. That is, the memory controller 70 overally controls an operation of the one NAND chip.

A file system mounting and booting operation of the one NAND chip is described below with reference to FIGS. 1 and 2.

For better understanding, let us assume that an operating system specific to an electron device system such as a portable computer (PC) or a portable multimedia device is booted after the flash memory device is attached to the electronic device system and then the file system is mounted onto the flash memory device.

The NAND flash memory 10 stores page data such as the size of data and a file to be written from an external portion and information as to whether data are read or written in a plurality of page data cells and stores spare data such as a boot loader, an ECC, information about a bad block, and information about the number of deletion times in a plurality of spare data cells.

The DRAM 20 receives information which are stored by scanning the object header data stored in a plurality of page data cells and the tag data in a plurality of spare data cells and performs an address-mapping operation for them in a tree structure when the file system of the flash memory device is mounted.

The SRAM 30 receives the booting code dumped from the boot loader stored in a plurality of spare data cells of the NAND flash memory 10 to temporarily store the information, and the control logic portion 40 stores an address and a command provided from the memory controller 70, receives an initial address of data to be read, and then automatically generates addresses and store them in the SRAM 30 again.

The memory controller 70 receives the booting code which is dumped to and temporarily stored in the SRAM 30 to boot a corresponding operating system of the electronic device system by using a predetermined booting program.

Meanwhile, the flash memory has a limited life span that data can be recorded in each sector, the life span closely relates to the number of times of electrical erase performed for each sector, and if the number of electrical erase times exceeds a predetermined value, there may occur an error in recording data.

In order to extend the life span of the flash memory, the number of erase times of the NAND flash memory 10 and a block setting of the NAND flash memory 10 to be deleted are controlled. The conventional one NAND chip separately needs areas in the NAND flash memory 10 for a plurality of spare data cells which store a boot loader, an ECC, information about a bad block, and information about the number of deletion times and also needs a process for temporarily storing information such as the ECC, the information about the bad block and information about the number of deletion times in the DRAM 20 and a process for dumping the booting code stored in a plurality of spare data cells from the boot loader to the SRAM 30 when the electronic device system is booted.

For these reasons, a speed for writing/reading data onto/from the NAND flash memory 10 is slow, and there is a problem in that data may be lost when powered off because the SRAM 30 temporarily store data as the data write and read buffer.

Figure 3:
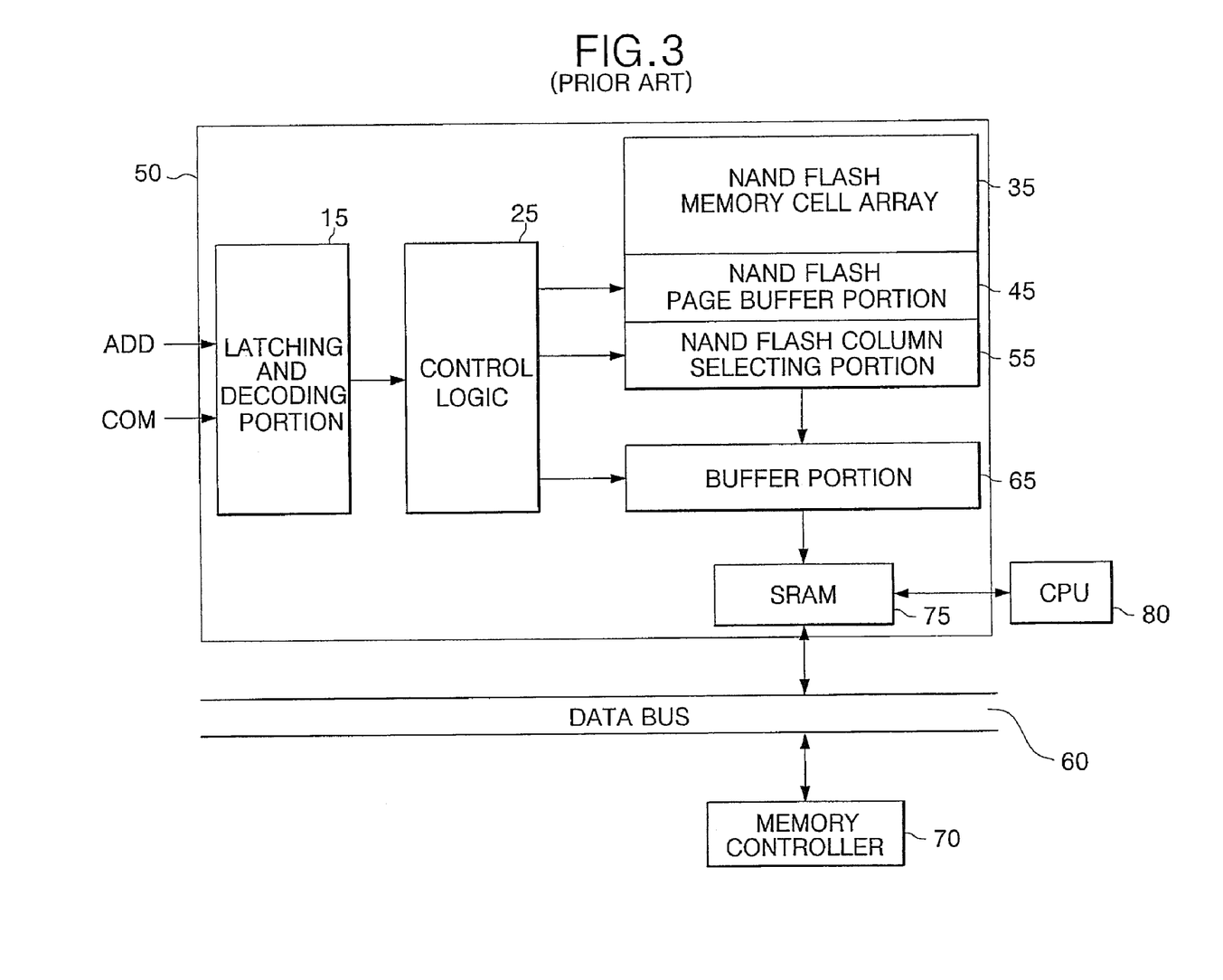
FIG. 3 is a block diagram illustrating a flash memory system with a conventional one NAND flash memory.

FIG. 3 is a block diagram illustrating a flash memory system with a conventional one NAND flash memory. The flash memory system of FIG. 3 comprises a latching and decoding portion 15, a control logic 25, a NAND flash memory cell array 35, a NAND flash page buffer 45, a NAND flash column selecting portion 55, a buffer portion 65, an SRAM 75, a memory bus 60, a memory controller 70, and a CPU 80. The NAND flash memory cell array 35 is divided into a plurality of pages which comprise a plurality of page data cells and a plurality of spare data cells, each page comprises one or more sectors, and each sector comprises a plurality of memory cells.

An operation of the conventional one NAND flash memory system is described below with reference to FIG. 3.

When address information ADD and a command COM are applied from the electronic device system, the latching and decoding portion 15 latches, decodes and stores the information. The address information ADD contains a row address, a column address, a sector address, information about the number of sectors, and a page address. The command COM contains read and write commands, a program command, ad an erase command.

The control logic 25 overally controls an operation of the flash memory device according to which command the command COM stored in the latching and decoding portion 15 represents, and controls the NAND flash page buffer portion 45 according to the sector address and the information about of the number of sectors provided from the latching and decoding portion 15. For example, in case of desiring to read data corresponding to one sector in the NAND flash memory cell array 35, the control logic 25 controls the NAND flash page buffer portion 45 so that only the page buffers belonging to the selected sector can perform the read operation.

The NAND flash page buffer portion 45 comprises a plurality of page buffers which respectively correspond to columns of the NAND flash memory cell array 35, and reads data from the NAND flash memory cell array 35 under control of the control logic 60 during the read operation and temporarily stores the read data. The data may contain spare data as well as page data.

In response to a control operation of the control logic 25, the NAND flash column selecting portion 55 sequentially selects the page buffers of the NAND flash page buffer portion 45 in a certain unit according to the column address information ADD from the latching and decoding portion 15 and then outputs data bits of the selected page buffers.

The buffer portion 65 temporarily stores the data bits transmitted through the NAND flash column selecting portion 55 and outputs stored data DO under control of the control logic 25 when data of one page stored in the NAND flash page buffer portion 45 are inputted.

As the data write and read buffer, the SRAM 75 receives data through the memory bus and transfers the data to the buffer portion 65 when the write command is applied or receives page data stored in the page data cells in the NAND flash memory cell array 35 and outputs the page data outside the memory system while receiving the boot code which is stored in the spare data cells and dumped from the boot loader and temporarily storing the information.

The memory controller 70 provides the address information and the command to the flash memory device through the memory bus 60 and overally controls an operation of the flash memory device.

The CPU 80 executes an internal booting program to boot a corresponding operating system of the electronic device system by using the booting code which is copied to the SRAM which supports a random access since the flash memory device can not support a random access.

As described above, in the conventional one NAND flash memory device and the flash memory system, a plurality of spare data cells are located in the same row as a plurality of page data cells so that all of a plurality of page data cell areas and all of a plurality of spare data cell areas are selected by one row address, and they operates by distinguishing page data and spare data by using the column address.

When a defective block is found by testing the NAND flash memory 10, an operation for setting it as a defective block through defective block information of a plurality of spare data cells is performed, and there is a problem in that the erasing and writing speed is slow since a plurality of spare data cell areas comprise the NAND flash memory cell.

SUMMARY OF THE INVENTION

It is an object of the present invention to provide a flash memory device in which a limitation of a conventional flash memory device which is impossible to randomly access when a booting operation is performed in an electronic device system having a flash memory device to which a file system is mounted is got over and a non-volatile memory device used as a read or write buffer is integrated therein.

It is an object of the present invention to provide a flash memory system in which a limitation of a conventional flash memory device which is impossible to randomly access when a booting operation is performed in an electronic device system having a flash memory device to which a file system is mounted is got over and a non-volatile memory device used as a read or write buffer is integrated therein.

One aspect of the present invention provides a flash memory device, comprising: a first non-volatile memory including a plurality of page data cells, storing page data, and reading and outputting the stored page data when a read command is applied from an external portion; and a second non-volatile memory including a plurality of spare data cells respectively adjacent to the plurality of page data cells, storing spare data, scanning the spare data and temporarily storing corresponding information when a file system is mounted, reading and outputting the stored spare data when the read command is applied.

The second non-volatile memory is used as a data write and read buffer while loading a boot loader of an electronic device system to the second non-volatile memory to perform a booting operation.

Each of the plurality of page data cells and each of the plurality of spare data cells are combined to constitute one page, the page comprises at least one sector, and each sector comprises a plurality of memory cells.

The second non-volatile memory comprises a logic portion which controls a wear leveling function and a garbage collecting function which are necessary during a write operation of the first non-volatile memory and controls the number of erase times of the first non-volatile memory cell and a block setting of the first non-volatile memory to be deleted, in the second non-volatile memory region.

The first non-volatile memory is a NAND flash memory, and the second non-volatile memory is any of a FRAM, a PRAM, an MRAM, and a RRAM.

The logic portion is realized by a discrete chip in a multi-layer chip package form above an integrated circuit of a one-chip form of the first and second non-volatile memories.

The page data are data which have information including the size of data and a file to be written from an external portion and information as to whether data are read or written, and the spare data are data which have information including a boot loader, an error correction code (ECC), information about a bad block, and information about the number of deletion times.

Another aspect of the present invention provides a flash memory system, comprising: a flash memory device which stores page data in a plurality of page data cells and spare data in a plurality of spare data cells, reads the stored page data and the stored read data when a read command is applied from an external portion, and sequentially selecting a plurality of first or second page buffers according to address information applied from the external portion to output data; a central processing device which receives the spare data and executes a stored booting program to boot an operating system of an electronic device system; a memory controller which provides address information and a command to the flash memory device and controls an overall operation of the flash memory device; and a memory bus which serves as a medium for transmitting data, address information and a command between the flash memory device and the memory controller.

The flash memory device comprises a latching and decoding portion for receiving address information and a command from an external portion, and latching and decoding the address information and the command; a first non-volatile memory including the plurality of page data cells and the plurality of first page buffers, storing page data in the plurality of page data cells, and sequentially selecting the plurality of first page buffers according to the address information to output data when a read command is applied from the external portion; a second non-volatile memory including the plurality of spare data cells respectively adjacent the plurality of page data cells and the plurality of second page buffers, storing the spare data in the plurality of spare data cells, scanning the spare data to temporarily corresponding information when a file system is mounted, and sequentially selecting the plurality of second page buffers to output data according to the address information when the read command is applied; and a control logic which controls overall operations of the first and second non-volatile memories in response to the decoded address information and the decoded command.

The first non-volatile memory comprises a first non-volatile memory cell array which includes the plurality of page data cells and stores the page data; a first page buffer portion which includes the plurality of first page buffers respectively corresponding to columns of the first non-volatile memory cell array, and reading and temporarily storing data from the first non-volatile memory cell array in response to control of the control logic when the read command is applied; and a NAND flash column selecting portion which outputs the temporarily stored page data to the selected first page buffers after sequentially selecting the plurality of first page buffers according to the decoded address information in response to control of the control logic.

The second non-volatile memory further comprises a second non-volatile memory cell array which includes a plurality of spare data cells which have the same row address as and are adjacent to the plurality of page data cells, respectively, and stores the spare data; a second page buffer portion which includes the plurality of second page buffers respectively corresponding to columns of the second non-volatile memory cell array, and reads and temporarily stores the spare data from the second non-volatile memory cell array in response to control of the control logic when the read command is applied; a second non-volatile memory cell column selecting portion which outputs the temporarily stored data to the selected page buffers after sequentially selecting the plurality of second page buffers according to the decoded address information in response to control of the control logic; a second non-volatile memory control portion which receives the decoded command from the control logic to output a second non-volatile memory control signal to overally control read and write operations of the second non-volatile memory; and a second non-volatile memory row decoder which receives the latched address information and decodes a row address of the second non-volatile memory to have the same address as a row address for selecting a page in the page data cell.

The flash memory device further comprises a buffer portion which receives data to be programmed in the first non-volatile memory cell array from the electronic device system and temporarily stores the data, and transmits the data to the first page buffer portion in response to control of the control logic, and also receives and temporarily stores page data of the selected first page buffers and spare data of the selected second page buffers and outputs the page data and the spare data which are temporarily stored to an external portion in response to control of the control logic.

The second non-volatile memory does not load a boot loader of the electronic device system to a discrete semiconductor memory device which supports a random access but performs a booting operation in the second non-volatile memory while being used as a data write and read buffer.

The first non-volatile memory is a NAND flash memory, and the second non-volatile memory is any of a FRAM, a PRAM, an MRAM, and a RRAM.

Each of the plurality of page data cells and each of the plurality of spare data cells are combined to constitute one page, the page comprises at least one sector, and each sector comprises a plurality of memory cells.

The address information comprises a row address, a column address, a sector address, information about the number of sectors, and a page address, and the command comprises a read command, a program command, and an erase command.

The page data are data which have information including the size of data and a file to be written from an external portion and information as to whether data are read or written, and the spare data are data which have information including a boot loader, an error correction code (ECC), information about a bad block, and information about the number of deletion times.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 4:
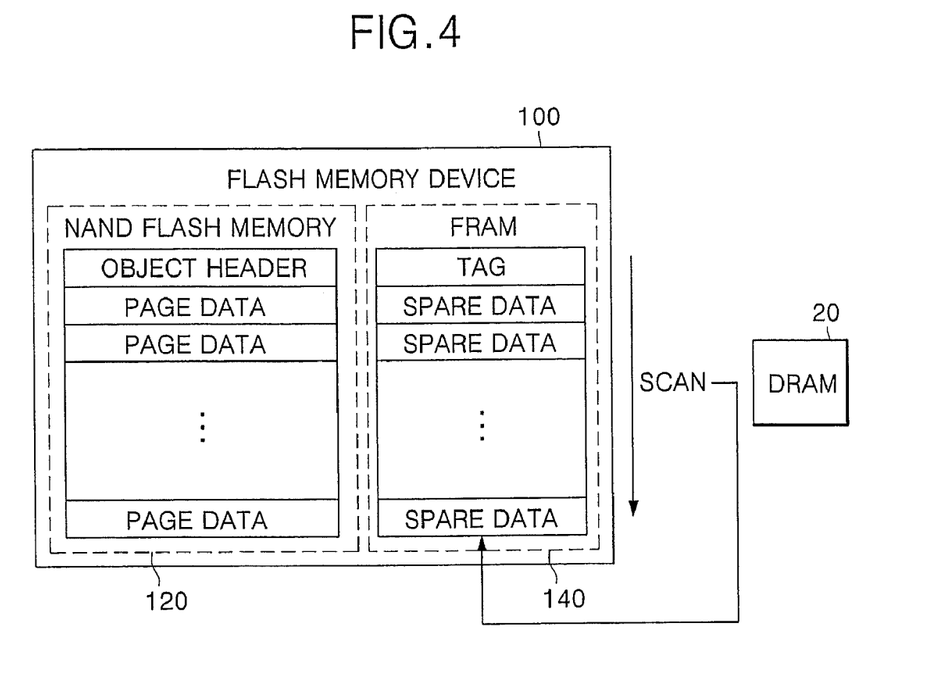
FIG. 4 is a block diagram illustrating a flash memory device having a file system mounted therein according to an exemplary embodiment of the present invention.

FIG. 4 is a block diagram illustrating a flash memory device having a file system mounted therein according to an exemplary embodiment of the present invention. As shown in FIG. 4, a flash memory device 100 and a DRAM 20 are provided. The flash memory device 100 comprises a NAND flash memory 120 for storing page data and a ferroelectric random access memory (FRAM) 140 for storing spare data.

A plurality of pages are formed such that object headers which comprise a plurality of page data stored in the NAND flash memory 120 match with a plurality of tags stored in the FRAM 140 by one-to-one correspondence.

Compared to the conventional flash memory device of FIG. 1, the flash memory device of FIG. 4 is same in a standpoint that page data such as the size of data and a file to be written from an external portion and information as to whether data are read or written which are stored in a data area are stored in the NAND flash memory 120, but it is different in a standpoint that spare data such as a boot loader, an error correcting code (ECC), information about a bad block, and information about the number of deletion times are stored in a discrete FRAM 140 cell instead of a plurality of spare data cells of the NAND flash memory 120.

Functions of the components of FIG. 4 are described below.

The NAND flash memory 120 comprises a plurality of page data cells, stores page data and then reads the stored page data to output data when a read command is applied from the external portion.

The FRAM 140 comprises a plurality of spare data cells, which respectively have the same row address as and are adjacent to a plurality of page data cells, stores spare data, then scans the spare data to temporarily store corresponding information by itself, and reads and outputs the stored spare data when the read command is applied.

When the flash memory device is installed in the electronic device and the file system is mounted on the flash memory device, a mounting time can be significantly reduced by scanning information the spare data cell area of the FRAM 140 which is a non-volatile RAM which is faster in a read and write time than the conventional flash memory device which scans data of the NAND flash memory 120 area due to a limitation of the flash memory device that a random access is impossible.

In general, the FRAM randomly accesses data to read the data and writes data without erasing the data, and thus its data access time is 1,000 time faster than the NAND flash memory.

Figure 5:
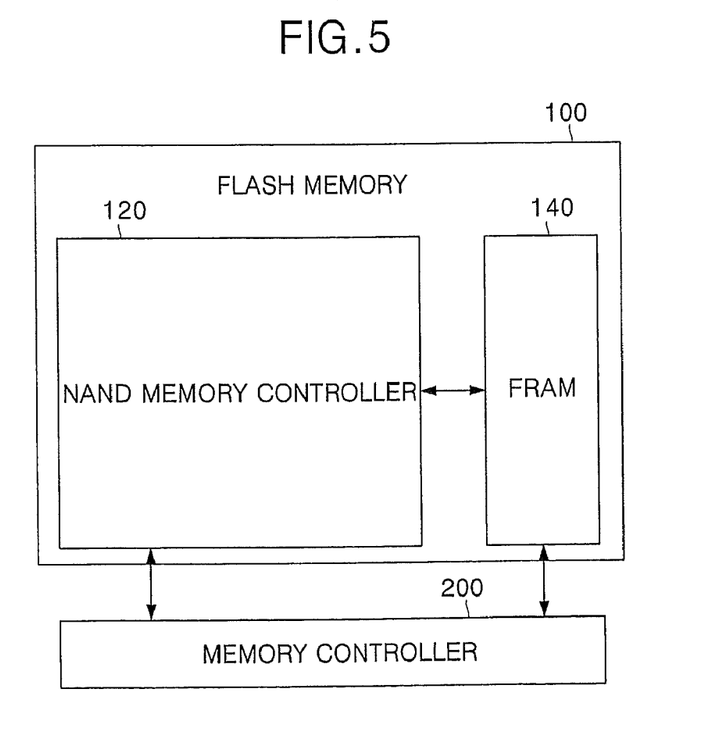
FIG. 5 is a block diagram illustrating a booting operation of the flash memory device of the present invention in which the NAND flash memory and the FRAM are integrated into a one chip.

FIG. 5 is a block diagram illustrating a booting operation of the flash memory device of the present invention in which the NAND flash memory and the FRAM are integrated into a one chip. The flash memory device of FIG. 5 comprises the NAND flash memory 120, the FRAM 140, and a memory controller 200.

Functions of the components of FIG. 5 are described below.

The NAND flash memory 120 comprises a plurality of page data cells, stores page data such as the size of data and a file to be written from the external portion and information as to whether data are read or written, and then reads the stored page data to output data when a read command is applied from the external portion.

The FRAM 140 stores spare data such as a boot loader, an ECC, information about a bad block, and information about the number of deletion times and serves as a data write and read buffer.

The memory controller 200 overally controls an operation of the flash memory device 100, for example, it provides address information and a command to the NAND flash memory 120 and the FRAM 140.

Therefore, the boot loader for a booting is stored in the non-volatile RAM and is used in a personal computer (PC) or a portable multimedia device, and an eXecute In Place (XIP) function for performing a booting on the non-volatile RAM "as is" is realized without loading the boot loader which is a booting program, whereby a booting time can be significantly reduced, and also the non-volatile RAM is used as the data read/write buffer, and so data are not lost even when powered off, whereby an operating performance of the NAND flash memory 120 can be significantly improved.

That is, differently from the conventional flash memory device in which when the flash memory device is attached to the system to perform a booting since it can not support a random access, the booting code is copied to the SRAM which supports a random access and the CPU accesses the SRAM to execute the program, according to the flash memory device of the present invention, the CPU executes the booting program by using the booting code stored in the FRAM 140 in the flash memory device.

Also, since the NAND flash memory 120 and the FAM 140 are integrated into a one chip, the ECC of the NAND flash memory 120 cell or the information about the bad block can be stored directly in the FRAM 140 during the memory test process, so that there is a need for discretely preparing for a plurality of spare data cell areas in the NAND flash memory 120.

A file system mounting and booting operation of the flash memory device according to the present invention is described below with reference to FIGS. 4 and 5.

For better understanding, let us assume that an operating system specific to an electron device system such as a portable computer (PC) or a portable multimedia device is booted after the flash memory device is attached to the electronic device system and then the file system is mounted onto the flash memory device.

The NAND flash memory 120 stores page data such as the size of data and a file to be written from the external portion and information as to whether data are read or written in a plurality of page data cells, and the FRAM 140 stores spare data such as a boot loader, an ECC, information about a bad block, and information about the number of deletion times in a plurality of spare data cells.

When the file system of the flash memory device 100 is mounted, the FRAM 140 receives information which are stored by scanning the object header data stored in a plurality of page data cells and the tag data in a plurality of spare data cells and performs an address-mapping operation for them in a tree structure.

The FRAM 140 temporarily stores the information by using the booting code through the boot loader stored in a plurality of spare data cells therein, and the control logic portion stores an address and a command provided from the memory controller 200, receives the initial address of data to be read, and automatically generates the next addresses and stores them in the FRAM 140 again.

The memory controller 200 overally controls an operation of the flash memory device 100, for example, it provides address information and a command to the NAND flash memory 120 and the FRAM 140.

Figure 6:
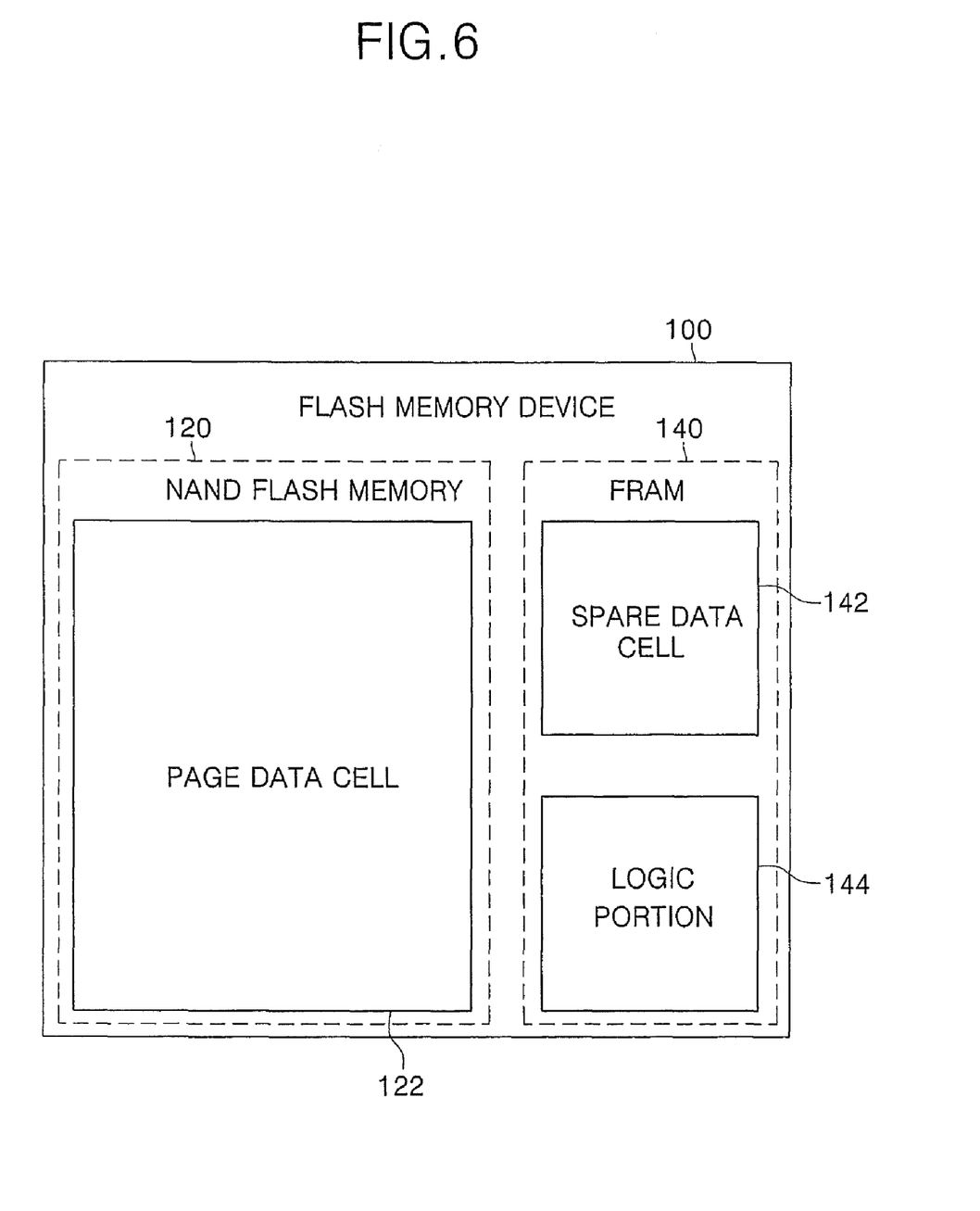
FIG. 6 is a block diagram illustrating a flash memory device according to the exemplary embodiment of the present invention.

FIG. 6 is a block diagram illustrating a flash memory device according to the exemplary embodiment of the present invention. The flash memory device of FIG. 6 comprises the NAND flash memory 120 and the FRAM 140. The NAND flash memory 120 comprises a plurality of page data cells 122, and the FRAM 140 comprises a plurality of spare data cells 142 and a logic portion 144.

Functions of the components of FIG. 6 are described below.

Functions of the NAND flash memory 120 and the FRAM 140 are identical to those of the flash memory device of FIG. 5 in which the NAND flash memory 120 and the FRAM 140 are integrated into a one chip, and thus descriptions on those are omitted.

The logic portion 144 controls a wear leveling function and a garbage collecting function which are necessary during a write operation of the NAND flash memory 120 and controls the number of erase times of the NAND flash memory 120 and a block setting of the NAND flash memory 120 to be deleted by using the FRAM 140 having information about a plurality of spare data cells 142 stored therein or other storage areas of the FRAM 140.

Here, it is possible to realize the logic portion 144 with a discrete chip on the flash memory device 100 in which the NAND flash memory 120 and the FRAM 140 are integrated into a one chip in a multi-chip package (MCP) form.

Figure 7:
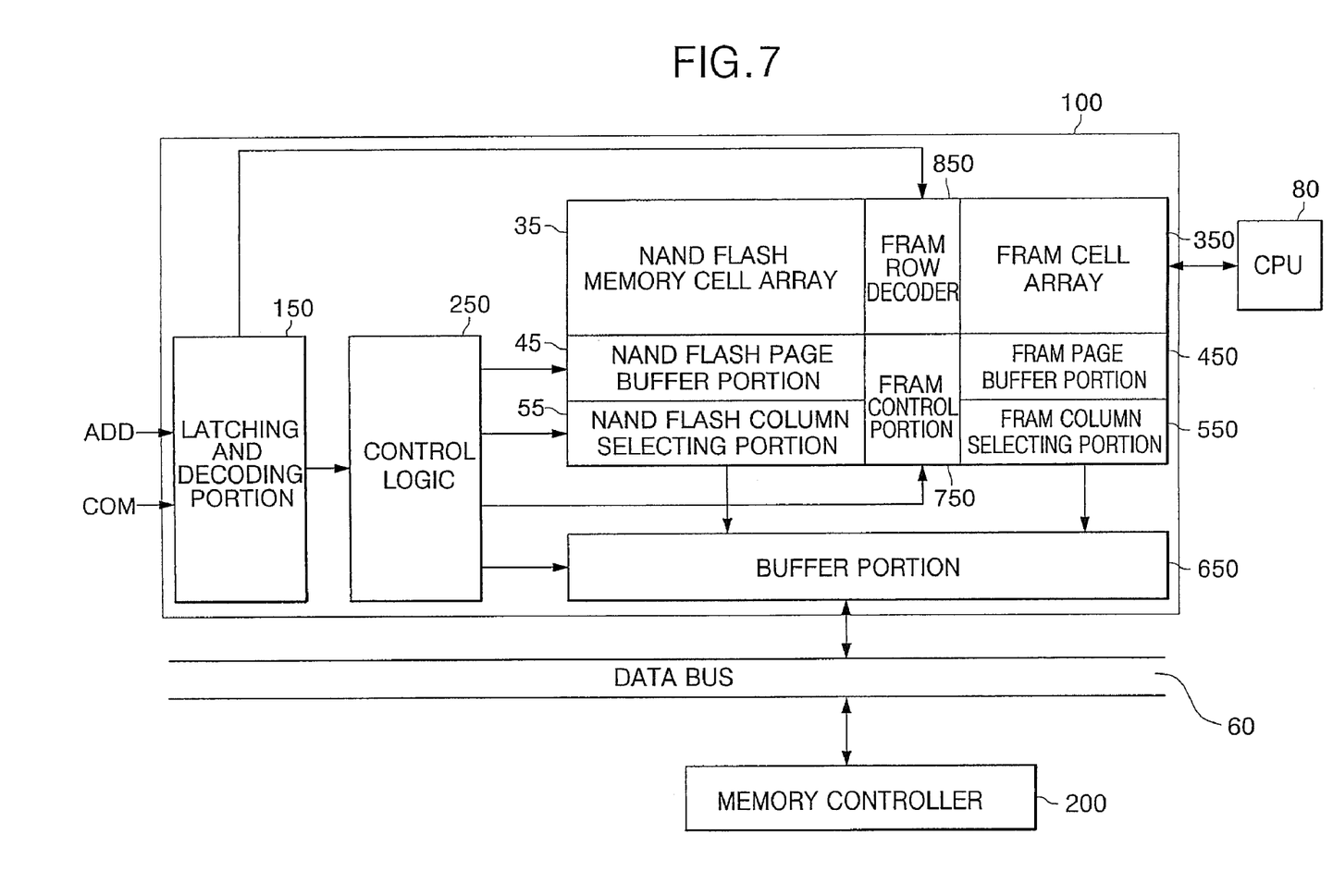
FIG. 7 is a block diagram illustrating a flash memory system with the flash memory device according to the exemplary embodiment of the present invention.

FIG. 7 is a block diagram illustrating a flash memory system with the flash memory device according to the exemplary embodiment of the present invention. The flash memory system of FIG. 7 comprises a NAND flash memory cell array 35, a NAND flash page buffer portion 45, a NAND flash column selecting portion 55, a buffer portion 650, a latch and decoding portion 150, a control logic 250, a FRAM cell array 350, a FRAM page buffer 450, a FRAM column selecting portion 550, a FRAM control portion 750, a FRAM row decoder 850, a memory bus 600, a memory controller 200, and a CPU 800.

The NAND flash memory cell array 35 is divided into a plurality of pages which comprise a plurality of page data cells 122, the FRAM cell array 350 is divided into a plurality of pages which comprise a plurality of spare data cells 142, each page comprises one or more sectors, and each sector comprises memory cells of plural-bytes.

Functions of the components of FIG. 7 are described below.

The NAND flash memory cell array 35 stores data such as the size of data and a file to be written from the external portion, and information as to whether data are read or written, and the FRAM cell array 350 replaces a plurality of spare data cells in the conventional flash memory and is same in storing a boot loader, an ECC, information about a bad block, and information about the number of deletion times, but it is different in a standpoint that the read speed is faster and data can be written without erasing the previous data.

The NAND flash page buffer portion 45 and the FRAM page buffer portion 450 comprises page buffers which respectively correspond to columns of the NAND flash memory cell array 35 and the FRAM cell array 350, respectively, read data from the NAND flash memory cell array 35 or the FRAM cell array 350 under control of control logic 250 during the read operation and temporarily store the read data.

The NAND flash column selecting portion 55 and the FRAM column selecting portion 550 sequentially select page buffers of the NAND flash page buffer portion 45 and the FRAM page buffer portion 450 before outputting data bits of the selected page buffers according to the column address information from the latching and decoding portion 150 in response to the control of the control logic 250, respectively.

The buffer portion 650 temporarily stores the data bits transmitted through the NAND flash column selecting portion 55 and the FRAM column selecting portion 550 and outputs stored data DO to the external portion under control of the control logic 250 when data of one page stored in the NAND flash page buffer portion 45 and the FRAM page buffer portion 450 are inputted. The buffer portion 650 temporarily stores data to be programmed in the NAND flash memory cell array 35 from the electronic device system and then transfers them to the NAND flash page buffer portion 45 through the NAND flash column selecting portion 55.

The latching and decoding portion 150 receives, latches, decodes and stores address information ADD and a command COM from the electronic device system. The address information ADD contains a row address, a column address, a sector address, information about the number of sectors, and a page address. The command COM contains read and write commands, a program command, ad an erase command.

The control logic 250 controls an overall operation of the flash memory device 100 according to which of read, program and erase commands the command COM stored in the latching and decoding portion 150 represents, and controls the NAND flash page buffer portion 45 and the FRAM page buffer portion 450 according to the sector address and the information about the number of sectors provided from the latching and decoding portion 150.

For example, in case of desiring to read data corresponding to one sector, the control logic 25 controls the NAND flash page buffer portion 45 and the FRAM page buffer 450 so that only the page buffers belonging to the selected sector can perform the read operation.

The FRAM control portion 750 receives a discrete non-volatile memory control signal from the control logic 250 to control the read and write operations of the FRAM 140 since the read and write operations of the FRAM 140 are different from those of the NAND flash memory.

The FRAM row decoder 850 decodes a row address of the FRAM cell to have the same address as a row address for selecting a page in a plurality of page data cells 122.

The FRAM column selecting portion 550 receives a discrete non-volatile memory control signal from the control logic to decode a column address of the FRAM cell since the read and write speeds are much faster than those of the NAND flash memory.

The CPU 80 executes the booting program by using the booting code stored in the FRAM cell array 350 which supports a random access to boot a corresponding operating system of the electronic device system.

The memory controller 200 controls an overall operation of the flash memory device, for example, it provides address information and a command to the NAND flash memory and the FRAM.

The memory bus 60 transfers data, address information and a command between the NAND flash memory and the FRAM and the memory controller.

An operation of the flash memory system according to the exemplary embodiment of the present invention is described below with reference to FIG. 3.

Most operations of the flash memory system of FIG. 7 are same as those of the conventional flash memory system of FIG. 3, and thus only different operations are described.

The latching and decoding portion 150 receives a sector address, information about the number of sectors, and page address information from the electronic device system and further receives address information of the FRAM cell array 350 as well as address information of the NAND flash memory cell array 35.

The control logic 250 controls the FRAM page buffer portion 450 as well as the NAND flash page buffer portion 45 according to the address ADD and the command COM provided from the latching and decoding portion 150 to read and temporarily store data from the NAND flash memory cell array 35 and the FRAM cell array 350 when the read command is applied.

The FRAM column selecting portion 550 receives a non-volatile memory control signal different from that for the NAND flash column selecting portion 55 from the control logic since the read and write speeds are much faster than those of the NAND flash memory, sequentially the page buffers of the FRAM page buffer portion 450 in a predetermined unit, and then outputs data bits of the selected page buffers.

The buffer portion 650 temporarily stores spare data transferred through the FRAM column selecting portion 550 as well as page data transferred from the NAND flash column selecting portion 55 and outputs data DO stored under control of the control logic 250 when data of one page stored in the FRAM page buffer portion 450 are inputted.

Due to the difference of a data access speed between the NAND flash memory cell array 35 and the FRAM cell array 350, the FRAM cell array 350 serves as the data write and read middle buffer of the NAND flash memory cell array 35 while temporarily storing the booting code information by using the boot loader stored in the spare data cells therein.

The CPU accesses the FRAM cell array 350 which supports a random access and receives the stored booting code to execute the booting program to thereby boot the corresponding operating system of the electronic device system.

At this time, the memory controller 200 controls an overall operation of the flash memory device through the memory bus 60, for example, it provides the address information and the command to the NAND flash memory and the FRAM.

Accordingly, the flash memory device and the flash memory system according to the present invention performs the fast data read operation and writes data without erasing the previous data, having the previous function of the conventional flash memory device "as is", since the page data are stored in the NAND flash memory cell array 35 and the spare data having the row address as the page data are stored in the FRAM cell array 350.

In the above description, for easy description, the FRAM has been used as a representative non-volatile memory, but the non-volatile memory is not limited to the FRAM but may comprises PRAM, MRAM, RRAM, and so on.

As described above, according to the present invention, since the NAND flash memory does not need to have the discrete spare data cell area, a time for mounting the file system of the NAND flash memory on the electronic device system and the booting time are significantly reduced, and since the non-volatile RAM is used as the read and write buffer of the NAND flash memory, an operating performance of the NAND flash memory is improved, and data can be maintained even when powered off.

Accordingly, as described above with respect to FIG. 7, an integrated circuit memory device 100 according to an embodiment of the present invention includes a non-randomly accessible nonvolatile memory 35, which has a first plurality of rows of nonvolatile memory cells therein, and a randomly accessible nonvolatile memory 350, which has a second plurality of rows of nonvolatile memory cells therein. Circuitry is also provided for reading data in parallel from an addressed one of the first plurality of rows and an addressed one of the second plurality of rows, in response to a memory read operation. This circuit, which is electrically coupled to the non-randomly accessible nonvolatile memory 35 and the randomly accessible nonvolatile memory 350, includes a page buffer circuits 45 and 450, column selection circuits 55 and 550 and an output page buffer circuit 650. In this embodiment, the first plurality of rows of nonvolatile memory cells in the non-randomly accessible nonvolatile memory 35 map one-to-one to the second plurality of rows of nonvolatile memory cells the randomly accessible nonvolatile memory 350. The non-randomly accessible nonvolatile memory 35 may be a NAND-type flash memory and the randomly accessible nonvolatile memory 350 may be a memory selected from a group consisting of FRAM, PRAM, MRAM and RRAM.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A semiconductor system, comprising:
   a flash memory device which stores page data in a plurality of page data cells of a first non-volatile memory and spare data in a plurality of spare data cells of a second non-volatile memory, reads the stored page data and the stored spare data when a read command is applied from an external portion, and sequentially selects a plurality of first or second page buffers according to address information applied from the external portion to output the page data and the spare data;
   a central processing device which receives the spare data and executes a stored booting program to boot an operating system of an electronic device system;
   a memory controller which provides address information and a command to the flash memory device and controls an operation of the flash memory device;
   a memory bus which serves as a medium for transmitting data, address information and a command between the flash memory device and the memory controller; and
   a row decoder configured to decode a row address of the second non-volatile memory to have the same address as a row address for selecting a page in the first non-volatile memory,
   wherein the first non-volatile memory and the second non-volatile memory are different types of non-volatile memory.

2. The semiconductor system of claim 1, wherein the flash memory device comprises:
   a latching and decoding portion for receiving address information and a command from an external portion, and latching and decoding the address information and the command;
   the first non-volatile memory including the plurality of page data cells and the plurality of first page buffers, storing page data in the plurality of page data cells, and sequentially selecting the plurality of first page buffers according to the address information to output data when a read command is applied from the external portion;
   the second non-volatile memory including the plurality of spare data cells respectively adjacent the plurality of page data cells and the plurality of second page buffers, storing the spare data in the plurality of spare data cells, scanning the spare data to temporarily corresponding information when a file system is mounted, and sequentially selecting the plurality of second page buffers to output data according to the address information when the read command is applied; and
   a control logic which controls operations of the first and second non-volatile memories in response to the decoded address information and the decoded command.

3. The semiconductor system of claim 2, wherein the first non-volatile memory comprises:
   a first non-volatile memory cell array which includes the plurality of page data cells and stores the page data;
   a first page buffer portion which includes the plurality of first page buffers respectively corresponding to columns of the first non-volatile memory cell array, and reading and temporarily storing page data from the first non-volatile memory cell array in response to control of the control logic when the read command is applied; and
   a column selecting portion which sequentially selects the plurality of first page buffers according to the decoded address information in response to control of the control logic, and outputs the temporarily stored page data to the selected first page buffers.

4. The semiconductor system of claim 3, wherein the second non-volatile memory further comprises:
   a second non-volatile memory cell array which includes a plurality of spare data cells which have the same row address as and are adjacent to the plurality of page data cells, respectively, and stores the spare data;
   a second page buffer portion which includes the plurality of second page buffers respectively corresponding to columns of the second non-volatile memory cell array, and reads and temporarily stores the spare data from the second non-volatile memory cell array in response to control of the control logic when the read command is applied;
   a second non-volatile memory cell column-selecting portion which sequentially selecting the plurality of second page buffers according to the decoded address information in response to control of the control logic, and outputs the temporarily stored spare data to the selected page buffers; and
   a second non-volatile memory control portion which receives the decoded command from the control logic to output a second non-volatile memory control signal to control read and write operations of the second non-volatile memory,
   wherein the row decoder comprises a second non-volatile memory row decoder which receives the latched address information and decodes a row address of the second non-volatile memory to have the same address as a row address for selecting a page in the page data cell.

5. The semiconductor system of claim 4, wherein the control logic controls a wear leveling function and a garbage collecting function which are necessary during a write operation of the first non-volatile memory and controls the number of erase times of the first non-volatile memory cell and a block setting of the first non-volatile memory to be deleted.

6. The semiconductor system of claim 5, wherein the control logic is disposed in layer different from the layer which is disposed the first non-volatile memory and the second non-volatile memory.

7. The semiconductor system of claim 4, wherein the flash memory device further comprises:
- a buffer portion which receives data to be programmed in the first non-volatile memory cell array and temporarily stores the data, and transmits the data to the first page buffer portion in response to control of the control logic; and
- a buffer portion which receives and temporarily stores page data of the selected first page buffers and spare data of the selected second page buffers and outputs the page data and the spare data which are temporarily stored to an external portion in response to control of the control logic.

8. The semiconductor system of claim 4, wherein the second non-volatile memory performs a booting operation in the second non-volatile memory while being used as a data write and read buffer.

9. The semiconductor system of claim 4, wherein the first non-volatile memory is a NAND flash memory, and the second non-volatile memory is any of a FRAM, a PRAM, an MRAM, and a RRAM.

10. The semiconductor system of claim 4, wherein each of the plurality of page data cells and each of the plurality of spare data cells are combined to constitute one page, the page comprises at least one sector, and each sector comprises a plurality of memory cells.

11. The semiconductor system of claim 1, wherein the page data are data which have information including the size of data and a file to be written from an external portion and information as to whether data are read or written, and the spare data are data which have information including a boot loader, an error correction code (ECC), information about a bad block, and information about the number of deletion times.

12. A flash memory system, comprising:
- a flash memory device which stores page data in a plurality of page data cells of a first non-volatile memory and spare data in a plurality of spare data cells of a second non-volatile memory, reads the stored page data and the stored spare data when a read command is applied from an external portion, and sequentially selects a plurality of first or second page buffers according to address information applied from the external portion to output the page data and the spare data;
- a memory controller which provides address information and a command to the flash memory device and controls an operation of the flash memory device; and
- a memory bus which serves as a medium for transmitting data, address information and a command between the flash memory device and the memory controller;

wherein the first non-volatile memory and the second non-volatile memory are different types of non-volatile memory, wherein the flash memory device comprises:

a latching and decoding portion for receiving address information and a command from an external portion, and latching and decoding the address information and the command, the first non-volatile memory including the plurality of page data cells and the plurality of first page buffers, storing page data in the plurality of page data cells, and sequentially selecting the plurality of first page buffers according to the address information to output data when a read command is applied from the external portion;

the second non-volatile memory including the plurality of spare data cells respectively adjacent the plurality of page data cells and the plurality of second page buffers, storing the spare data in the plurality of spare data cells, scanning the spare data to temporarily corresponding information when a file system is mounted, and sequentially selecting the plurality of second page buffers to output data according to the address information when the read command is applied; and a control logic which controls operations of the first and second non-volatile memories in response to the decoded address information and the decoded command, and wherein the control logic controls a wear leveling function and a garbage collecting function which are necessary during a write operation of the first non-volatile memory and controls the number of erase times of the first non-volatile memory cell and a block setting of the first non-volatile memory to be deleted.

13. The flash memory system of claim 12, wherein the control logic is disposed in layer different from the layer which is disposed the first non-volatile memory and the second non-volatile memory.

14. The flash memory system of claim 12, wherein the control logic is realized by a discrete chip in a multi-layer chip package form above an integrated circuit of a one-chip form of the first and second non-volatile memories.

* * * * *